United States Patent [19]

Hamada

[11] 3,976,955
[45] Aug. 24, 1976

[54] PROTECTIVE CIRCUIT FOR PULSE WIDTH MODULATED SIGNAL AMPLIFIER

[75] Inventor: Osamu Hamada, Tokyo, Japan

[73] Assignee: Sony Corporation, Tokyo, Japan

[22] Filed: Mar. 25, 1975

[21] Appl. No.: 561,923

[30] Foreign Application Priority Data
Mar. 30, 1974 Japan.............................. 49-36172

[52] U.S. Cl. .............................. 330/207 P; 330/10; 330/207 A
[51] Int. Cl.² ..................................... H03F 3/387
[58] Field of Search ............... 330/10, 207 P, 207 A

[56] References Cited
FOREIGN PATENTS OR APPLICATIONS
4,329,681  5/1968  Japan .............................. 330/207 P Primary Examiner—James B. Mullins
Attorney, Agent, or Firm—Hill, Gross, Simpson, Van Santen, Steadman, Chiara & Simpson

[57] ABSTRACT

A protective circuit for a pulse width modulated signal amplifier includes a signal input circuit, a carrier signal generator, a pulse width modulator for receiving both the output signals of the signal input circuit and the carrier signal generator and for producing a pulse width modulated signal, an amplifier for receiving the pulse width modulated signal and for amplifying it to drive a load through a low pass filter, a detecting circuit for detecting whether the pulse width modulated signal is present or not, or detecting DC voltage of undesirable duration produced at the output of the amplifier and for producing a control signal, and a protective circuit activated by the control signal for cutting off the operation of the amplifier.

8 Claims, 4 Drawing Figures

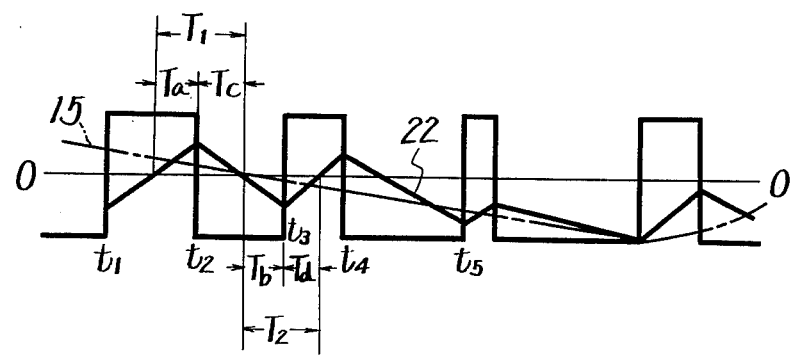
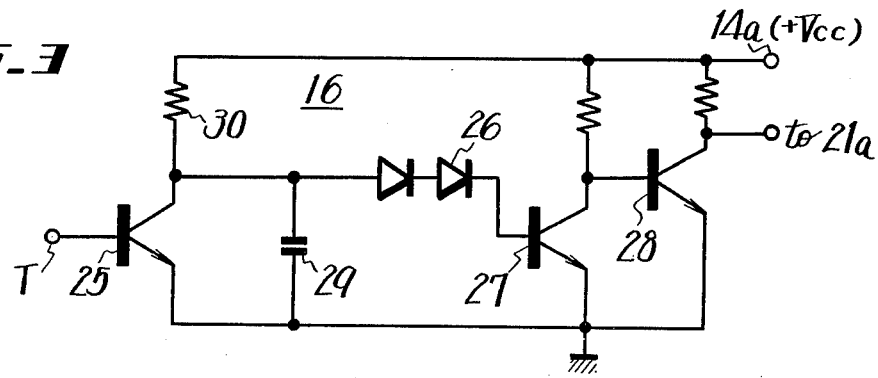
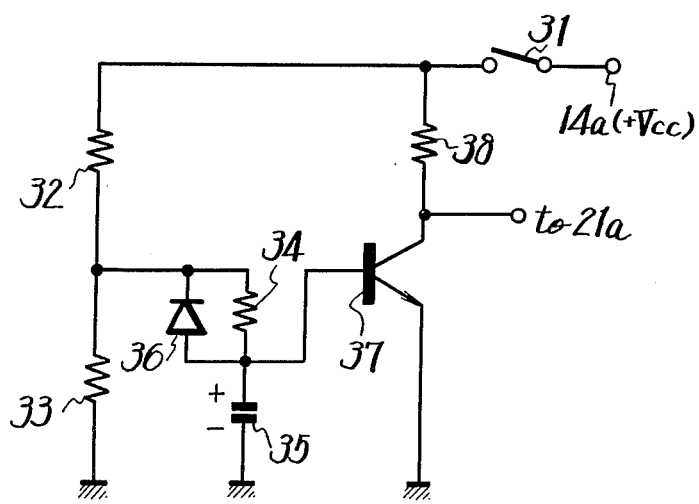

PROTECTIVE CIRCUIT FOR PULSE WIDTH MODULATED SIGNAL AMPLIFIER

BACKGROUND OF THE INVENTION

1. Field of the Invention

This invention relates to a protective circuit for a pulse width modulated signal amplifier, and more particularly to a protective circuit for a pulse width modulated signal amplifier having a simple construction and a reliable operation.

2. Description of the Prior Art

A pulse width modulated signal amplifiers using low frequency amplifiers with large outputs are known in the art. Transistors used in such amplifiers have the advantage that the efficiency of the system is superior since they perform on-off operations with a pulse width modulated carrier signal of frequency normally in a range of 100 KHz to 500 KHz, but they also have the drawback that they are susceptible to destruction by heat in comparison to prior art class B or class AB push-pull amplifiers.

A number of protective circuits have been proposed for class B or class AB push-pull amplifiers, but a protective circuit effective for use in pulse width modulated signal amplifiers has not yet been realized.

The prior art protective circuit for a pulse width modulated signal amplifier has the following problem. A transistor used in the pulse width modulated signal amplifier is normally turned on and off with a modulated carrier signal, but when the modulated carrier is stopped by some cause, the transistor keeps its on-state for a time longer than that in the case of normal operation and hence there is the danger that the transistor will be destroyed instantaneously.

SUMMARY OF THE INVENTION

It is a feature of the present invention to provide a protective circuit for a pulse width modulated signal amplifier which includes: a signal input circuit, a carrier signal generator, a pulse width modulator for receiving both the output signals of the signal input circuit and the carrier signal generator for producing a pulse width modulated signal; an amplifier for receiving the pulse width modulated signal and for amplifying it to drive a load through a low pass filter; a detecting circuit for detecting whether or not the pulse width modulated signal is present, or for detecting DC voltage of undesirable duration at the output of the amplifier and for producing a control signal, and a protective circuit for receiving the control signal so as to cut off the operation of the amplifier when it is present.

Accordingly, a main object of this invention is to provide a protective circuit for a pulse width modulated signal amplifier free from the above mentioned drawback.

Another object of this invention is to provide a protective circuit for a pulse width modulated signal amplifier such that the operation of the amplifier is cut off in response to the presence and absence of a modulated signal supplied from a pulse width modulator.

A further object of this invention is to provide a protective circuit for a pulse width modulated signal amplifier such that a DC voltage of undesirable duration reproduced at an output terminal of the pulse wisth modulated signal amplifier is detected thereby to cut off the operation of the amplifier.

A still further object of this invention is to provide a protective circuit for a pulse width modulated signal amplifier such that, in addition to the above described protection, a pop noise produced at a time of on- or off-operation of a power line switch is prevented from being reproduced through the pulse width modulated signal amplifier.

These and other features and advantages of the invention will be understood in greater detail from the following description taken in conjunction with the associated drawings.

BRIEF DESCRIPTION OF THE DRAWINGS

FIG. 2 is a waveform view showing the operation of the aforesaid embodiment;

FIG. 3 is a schematic circuit diagram showing one example of a circuit for detecting whether a modulated carrier signal is present or not; and FIG. 4 is a schematic circuit diagram showing one example of a circuit for generating a control signal in response to the on- or off-operation of a power line switch.

DESCRIPTION OF THE PREFERRED EMBODIMENT

Figure 1:
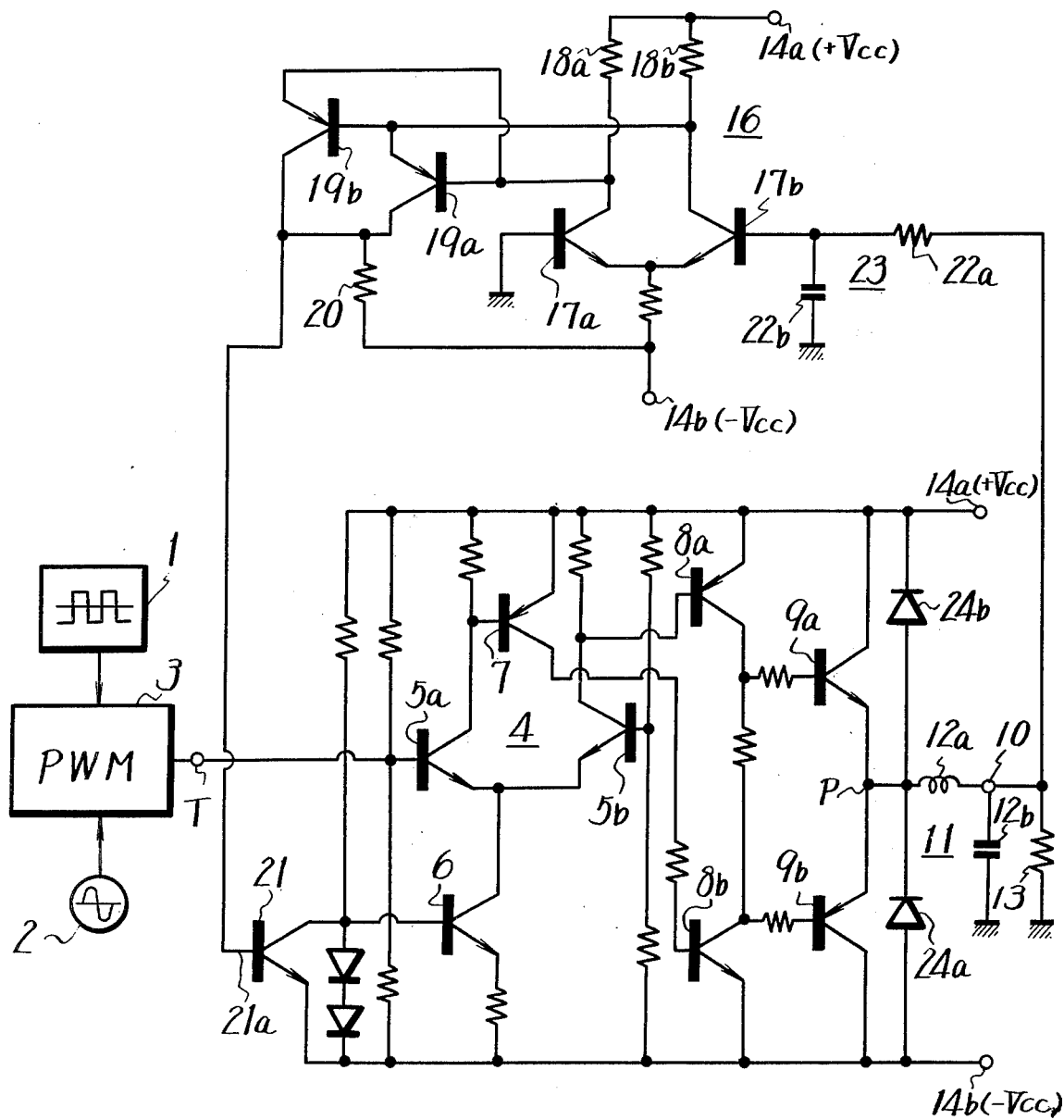
FIG. 1 is a schematic circuit diagram showing one embodiment of this invention.

A description will hereinafter be give of one example of this invention with reference to the drawings.

FIG. 1 shows a pulse generator 1 which produces a rectangular wave having a frequency of, for example, 100 KHz, 2 a source of modulation signals such as voice, and 3 a pulse width modulator to produce at terminal T a signal whose pulse width is modulated in response to the modulation signal 2. A differential amplifier 4 is composed of a pair of transistors 5a and 5b and a transistor 6 connected in the common current path thereof.

The above mentioned output signal from the modulator 3 is fed to the base electrode of either one of the transistors forming the differential amplifier 4. In this embodiment it is fed to transistor 5a. An output signal of the transistor 5a is applied through a transistor 7 to the base electrode of a transistor 8b, while the output signal of the transistor 5b is applied to the base electrode of a transistor 8a.

A pair of complementary output transistors 9a and 9b have their common output coupled to a point 10. The output of the transistors is coupled from a connection point P through a low pass filter 11 consisting of an inductance 12a and a capacitor 12b. The output terminal 10 is connected to a load or a loudspeaker 13. In this embodiment, there is illustrated an amplifier of so-called two-source system, in which a voltage source terminal 14a is connected to a positive voltage (+Vcc) source and a voltage source terminal 14b is connected to a negative voltage (−Vcc) source, respectively.

Accordingly, when the pulse width modulated signal from the pulse width modulator 3 makes the transistor 5a conductive, the transistor 7 is similarly made conductive and hence the transistor 8b is made conductive to make the output transistor 9b conductive. In this case, however, the transistor 5b is in a nonconductive state to make the transistor 8a nonconductive and hence the output transistor 9a is also made nonconductive. Meanwhile, when the transistor 5a is in a nonconductive state, the transistor 5b becomes conductive and hence the conditions of the output transistors 9a and 9b are reversed from those of the above case. Thus, the output transistors 9a and 9b are controlled to be ON and OFF alternately according to the pulse width modulated signal.

FIG. 2 shows the waveform of a voltage at the connection point P of the transistors 9a and 9b in the above case. It will be noticed from the waveform that the potential is substantially equal to the potential at the terminal 14a (or +Vcc in this example) during time period where the transistor 9a is conductive (between time points $t_1$ and $t_2$, $t_3$ and $t_4$ and so on), while the potential is substantially equal to the potential at the terminal 14b (or −Vcc in this example) during the time period when the transistor 9b is conductive (between time points $t_2$ and $t_3$, $t_4$ and $t_5$, and so on). As a result, when the signal as shown in FIG. 2 is obtained at the connection point P, this signal is fed to the low pass filter 11 to eliminate a high frequency component contained therein and only a low frequency signal component as shown by a dash-chain line 15 is supplied to the loudspeaker 13 so as to drive the same.

In the present invention, a detecting circuit 16 for detecting a DC signal reproduced at the output terminal 10 is provided to stop the switching operation of the output transistors 9a and 9b by an output signal therefrom. In the example of FIG. 1, the common transistor 6 of the differential amplifier 4 is controlled in response to the output signal of the DC signal detecting circuit 16 so that the transistor 6 is turned off when a DC signal is obtained at the connection point P for more than a certain time period. Thus, both the transistors 5a and 5b of the differential amplifier 4 are made nonconductive to render the paired output transistors 9a and 9b off.

In the detecting circuit 16, a pair of transistors 17a and 17b are connected to form a differential amplifier, in which the emitter electrodes of both the transistors 17a and 17b are connected to the negative voltage source terminal 14b and the collector electrodes thereof are connected respectively through resistors 18a and 18b to a positive voltage source terminal 14a. Further, the collector electrodes of the transistors 17a and 17b are respectively connected to the base electrodes of transistors 19a and 19b. The emitter electrode of the transistor 19a is connected to the base electrode of the transistor 19b while the emitter electrode of the transistor 19b is connected to the base electrode of the transistor 19a. The collector electrodes of both the transistors 19a and 19b are interconnected and further connected through a resistor 20 to the negative voltage source terminal 14b. In addition, the output of the detecting circuit 16 or the collector electrodes of the transistors 19a and 19b are connected to the base electrode of a transistor 21. The collector electrode of the transistor 21 is connected to the base electrode of the transistor 6 and also the emitter electrode thereof is connected to the negative voltage source terminal 14b. With the above construction, the transistors 21 and 6 can be controlled in response to a signal obtained at the output terminal 10. The input side of the transistor 17b is connected with a time constant circuit 23 consisting of a resistor 22a and a capacitor 22b so as to drive the detecting circuit 16 when a DC signal obtained at the terminal 10 is present for more than a certain time period or a time period determined by the time constant circuit 23.

Accordingly, in the case when no DC is produced at the terminal 10 or an AC signal is only produced to drive the loudspeaker 13 in a normal state, since the DC component at the output terminal 10 becomes zero, the collector voltages of the transistors 17a and 17b of the DC signal detecting circuit 16 are substantially the same. In this case, the base electrode of the transistor 21 is fed with the negative voltage -Vcc from the terminal 14b to make the same nonconductive, so that the transistor 6 is in a conductive state to drive the amplifier in a normal state.

When a DC voltage appears at the connection point P and continues for a certain time (a time determined by the time constant circuit 23), the transistor 17a or 17b is turned on to make the transistor 19a or 19b conductive. Thus, the positive DC voltage is applied to the base electrode of the transistor 21 through the transistor 19a or 19b to make it conductive and hence the transistor 6 is turned off. Thus, in the case when a positive or negative DC voltage is obtained at the connection point P, the transistor 6 is controlled to be turned off to make both the output transistors 9a and 9b nonconductive and hence the output transistors 9a and 9b as well as the loudspeaker 13 can be simultaneously protected.

The waveform of a current I flowing from the connection point P to the output terminal 10 in FIG. 1 is expressed in FIG. 2 by a curve 22. As will be obvious from the curve 22, during a time period $T_1$ a positive current flows and during a time period $T_2$ a negative current flows. During the time period $T_1$, however, the transistor 9a is in a conductive state only for a period shown by $T_a$. During a current flowing period represented by $T_c = T_1 - T_a$, the energy charged in the inductance 12a and the loudspeaker 13 is adapted to be discharged. For the above purpose, a diode 24a is connected between the negative voltage source terminal 14b and the connection point P in this example so that the current flows through the diode 24a during the above-mentioned current flowing period $T_c$ and no current flows through the transistor 9a. Similarly, during a period $T_d$ within the time period $T_2$ excepting the conductive period $T_b$ of a transistor 9b, a current is adapted to flow through a diode 24b. With the above described arrangement, the transistors 9a and 9b can be operated in a switching manner without lowering the efficiency.

In the above embodiment, a detected signal is derived from the load or loudspeaker 13. However, it is also possible that the pulse modulated signal itself is detected to control the transistor 6 by a circuit arrangement as shown in FIG. 3. In FIG. 3, a transistor 25 is provided with a capacitor 29 being connected between the collector and emitter electrodes thereof, and the collector electrode of the transistor 25 is connected through diodes 26 to the base electrode of a transistor 27. The collector electrode of the transistor 27 makes a cascade connection with the base electrode of a transistor 28, and the collector electrode of the transistor 28 is connected to the base electrode 21a of the transistor 21 shown in FIG. 1. With such a construction, a pulse modulated signal at the output terminal T of the pulse width modulator 3 is applied to the base electrode of the transistor 25. In this case, when the modulated signal is negative, the transistor 25 is nonconductive and hence the capacitor 29 is electrically charged through a resistor 30. However, when the modulated signal is positive, the transistor 25 is turned on to discharge the capacitor 29 through the collector and emitter path thereof. If the modulated signal disappears, a voltage across the capacitor 29 is increased and when the value of this voltage exceeds the sum of forward drop voltages $V_D$ and $V_{BE}$ of the diodes 26 and the transistor 27, respectively, the transistor 27 is turned on to make the transistor 28 conductive. Accordingly, the transistor 21 becomes conductive to make the transistor 6 non-conductive. Thus, the output transistors 9a and 9b and the loudspeaker 13 can be protected.

Further, in order to prevent a pop noise from being reproduced through the loudspeaker 13 by a DC voltage appearing at the output terminal 10 when the voltage source is switched on or off, the transistor 21 may keep its conductive state for a certain period after switching-on the voltage source. In other words, as depicted in FIG. 4, a control signal in response to on-off operation of an auxiliary switch 31, which is interlinked with a power line switch (not shown) and provided between the voltage source 14a and the ground, is adapted to be fed to the base electrode 21a of the transistor 21 in FIG. 1 so as to cut-off the transistor 6 for a certain time after the operation of the auxiliary switch 31.

In FIG. 4, a series connection of resistors 32 and 33 is inserted between the auxiliary switch 31 and the ground and the connection point between the above resistors is grounded through a resistor 34 and a capacitor 35. The resistor 34 is connected thereacross with a diode 36 with such a polarity as illustrated. The diode 36 is provided for the purpose of reducing the discharge time constant of electric charge stored in the capacitor 35 when the auxiliary switch 31 is turned off. A switching transistor 37 is provided with its base-emitter path being connected across the capacitor 35 and with its collector electrode being connected through a resistor 38 to one end of the auxiliary switch 31.

With such an arrangement, during a predetermined time period of on- or off-operation of the auxiliary switch 31 interlinked with the power line switch (not shown), the switching transistor 37 keeps its off-state to obtain a positive DC control signal at its collector electrode. The above control signal renders the transistor 21 shown in FIG. 1 to be conductive to cut off the operation of the differential amplifier. As a result, it is possible to prevent the pop noise from being reproduced in response to the on- or off-operation of a power line switch.

In accordance with this invention, a protective circuit for a pulse width modulated signal amplifier comprises a signal input circuit; a carrier signal generator; a pulse width modulator for receiving both the output signals of the signal input circuit and the carrier signal generator and for producing a pulse width modulated signal; an amplifier for receiving the pulse width modulated signal from the pulse width modulator and for amplifying it to drive a load through a low pass filter; detecting means for detecting whether the pulse width modulated signal is present or not, or detecting an undesirable DC signal produced at the output of the amplifier and for producing a control signal; and a protective circuit for receiving the control signal so as to cut off the operation of the amplifier when it is present.

Therefore, according to the protective circuit of this invention, an amplifier or a loudspeaker can be reliably protected with a simple construction. Further, it is possible to provide a protective circuit which prevents a pop noise from being produced when the power line switch performs its on- or off-operation with a simple additional circuit only and is quite effective for use in a pulse width modulated signal amplifier.

It will be understood that the invention is not limited to the above described embodiments and that various changes and modifications may be effected therein by one skilled in the art without departing from the scope or spirit of the invention.

I claim as my invention:

1. The combination of a pulse width modulated signal amplifier and a protective circuit comprising:
    means for producing a pulse width modulated signal,
    a low pass filter,
    a load,
    an amplifier for receiving said pulse width modulated signal and for amplifying the same,
    means for coupling the output of said amplifier through said low pass filter to drive said load,
    detecting means for detecting the amplitude of said pulse width modulated signal and for producing a control signal, and
    protective circuit means supplied with said control signal for cutting off said amplifier when the control signal is present.

2. A protective circuit for a pulse width modulated signal amplifier in accordance with claim 1 wherein said amplifier comprises a differential amplifier having a constant current source, a push-pull amplifying stage being coupled to the output of said differential amplifier and having its output coupled to drive said load through said low pass filter, said detecting means including a first switching circuit for receiving the pulse width modulated signal and for providing a control signal when its amplitude is reduced to a predetermined level, and wherein said protective circuit means includes a second switching circuit coupled to receive said control signal and also coupled to cut off the constant current source associated with said differential amplifier in response to the presence of said control signal.

3. A protective circuit in accordance with claim 2 wherein said first switching circuit comprises a transistor coupled to be conductive in the presence of pulse width modulated signals and includes a charging circuit coupled to be charged when said transistor is in a non-conductive state to produce said control signal.

4. The combination of a pulse width modulated signal amplifier and a protective circuit comprising:
    means for producing a pulse width modulated signal,
    means for demodulating said pulse width modulated signal,
    a load, an amplifier for receiving said pulse width modulated signal and for amplifying the same,
    means for DC coupling the output of said amplifier through said demodulator to drive said load,
    detecting means for detecting the presence of a DC signal at the output of said amplifier and for producing a control signal, and
    protective means for receiving said control signal so as to cut off the operation of said amplifier.

5. A protective circuit in accordance with claim 4 wherein said detecting means comprises a time constant circuit having a time constant larger than that associated with said demodulator means, and a switching circuit for receiving an output signal from said time constant circuit to produce said control signal in response thereto.

6. A protective circuit in accordance with claim 5 wherein said switching circuit comprises a differential amplifier and at least one further switching transistor, the input terminal of said differential amplifier being coupled to the output of said time constant circuit and said further switching transistor being coupled to the output of said differential amplifier so as to produce a control signal when the output of said time constant circuit exceeds a predetermined value.

7. A protective circuit in accordance with claim 6 wherein the amplifier used to amplify the pulse width modulated signal comprises a further differential amplifier having a constant current source, a push-pull amplifying stage being coupled to an output of said further differential amplifier and the output of said push-pull amplifying stage being coupled to the load through the demodulator circuit and wherein the protective means includes an additional switching circuit to receive the control signal and to directly cut off the operation of a constant current source associated with the further differential amplifier.

8. A protective circuit in accordance with claim 7 wherein a further detecting means is included, said further detecting means being arranged to be coupled to the main power supply switch of the pulse width modulator circuit and having means for producing a further control signal in response to the operation of said switch, said further control signal being supplied to the further switching circuit associated with said protective means.

* * * * *